United States Patent
Kamgaing et al.

(10) Patent No.: US 8,111,521 B2
(45) Date of Patent: Feb. 7, 2012

(54) PACKAGE-BASED FILTERING AND MATCHING SOLUTIONS

(75) Inventors: Telesphor Kamgaing, Chandler, AZ (US); Emile Davies-Venn, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 1217 days.

(21) Appl. No.: 11/835,960

(22) Filed: Aug. 8, 2007

(65) Prior Publication Data

US 2009/0039986 A1 Feb. 12, 2009

(51) Int. Cl.
*H05K 7/00* (2006.01)

(52) U.S. Cl. .......... 361/777; 361/720; 361/778

(58) Field of Classification Search .......... 361/776–778, 361/760, 720, 736, 748; 174/260–262; 257/777–778

See application file for complete search history.

(56) References Cited

U.S. PATENT DOCUMENTS

| 5,313,693 | A  | * | 5/1994 | Cachier | 257/701 |
| 6,424,223 | B1 | * | 7/2002 | Wang et al. | 330/286 |
| 6,670,692 | B1 | * | 12/2003 | Shih et al. | 257/532 |
| 7,145,233 | B2 | * | 12/2006 | Vinson et al. | 257/724 |
| 7,867,806 | B2 | * | 1/2011 | Graydon et al. | 438/64 |
| 2006/0192281 | A1 | * | 8/2006 | Lu et al. | 257/704 |
| 2006/0214289 | A1 | * | 9/2006 | Hansen | 257/728 |
| 2009/0096068 | A1 | * | 4/2009 | Sjoestroem | 257/666 |

* cited by examiner

*Primary Examiner* — Hung S Bui
(74) *Attorney, Agent, or Firm* — Winkle, PLLC

(57) ABSTRACT

A microelectronic package having a radio frequency (RF) amplifier circuit and, incorporating harmonic rejection filters and matching circuits integrally formed in the package is disclosed. A harmonic rejection filter may comprise a metal-insulator-metal (MIM) capacitor serially coupled between bond pads disposed on a RF amplifier circuit die, a first wire bond coupling a first bond pad to a package output, where the first bond pad is coupled to the output of the RF amplifier, and a second wire bond coupling a second bond pad to a package ground. The harmonic rejection filter may be appropriately configured to filter one or more harmonics at different frequencies.

9 Claims, 4 Drawing Sheets

PACKAGE-BASED FILTERING AND MATCHING SOLUTIONS

BACKGROUND

1. Technical Field

Embodiments of the invention relate to radio frequency (RF) microelectronic circuit packages fabricated with integral filtering and/or matching capabilities using wire bonds and metal-insulator-metal (MIM) capacitors.

2. Description of Related Art

Radio frequency (RF) Front-End modules for wireless communication systems utilize power amplifiers to amplify outgoing signals prior to external transmission through an antenna. Undesirable high order harmonics may be generated at the output of the power amplifier due to its non-linear performance and high level of power to be transmitted. To ensure acceptable signal quality, undesired high order harmonics are filtered prior to transmission through the antenna. In addition, input and output matching networks may be implemented at interfaces of active RF circuits, e.g. low noise amplifier and power amplifier, to optimize signal transfer.

Currently, a harmonic rejection filter implemented at the output of a power amplifier may be either a low-pass filter or a simple notch filter. The filter is typically fabricated and disposed external of the RF package as a discrete or embedded component. Further, input and output matching circuits are typically integrated at the die using metal-insulator capacitors, and spiral inductors which require thick metal plating to achieve high Q factor (quality factor) performance. It follows that the use of external filters and thick metal spiral inductors enlarges package form factor and at the same time increases manufacturing costs.

DETAILED DESCRIPTION OF ILLUSTRATIVE EMBODIMENTS

Figure 1A:
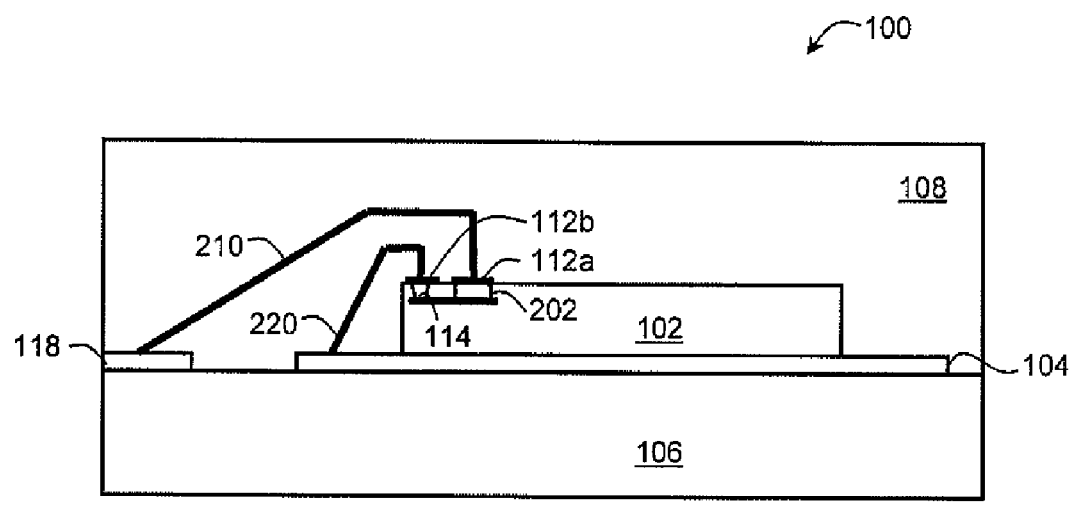
FIG. 1A is a partial cross-sectional view of a microelectronic package incorporating a single-rejection output harmonic rejection filter according to one embodiment of the invention.

In the following description, numerous specific details are set forth in order to provide a thorough understanding of various illustrative embodiments of the present invention. It will be understood, however, to one skilled in the art, that embodiments of the present invention may be practiced without some or all of these specific details. In other instances, well known process operations have not been described in detail in order not to unnecessarily obscure pertinent aspects of embodiments being described. In the drawings, like reference numerals refer to same or similar functionalities or features throughout the several views.

Embodiments of the invention relate to radio frequency (RF) microelectronic packages incorporating filtering and matching capabilities. More specifically, various combinations of on-die metal-insulator-metal capacitor and package wire bonds may be implemented in RF active dies, e.g. a power amplifier, to provide filtering and matching solutions.

FIG. 1A is a partial cross-sectional view of a microelectronic package 100 incorporating a single-rejection output harmonic rejection filter 200 according to one embodiment of the invention. In the microelectronic package 100, an active die 102, containing at least an RF amplifier circuit to perform the logic of its intended application, may be coupled to a ground plane 104. The ground plane 104 may be either a metal layer on the package topmost layer or a stackup of both package metal and a metallization layer on the back of the die 102. In either case, a conductive die-attach material may be used to attach the die 102 to the package substrate 106. The ground plane 104 may be configured as a common ground for the package 100 and the die 102. Examples of suitable materials for the package substrate 106 include, but are not limited to, quad-flat-no-lead (QFN), thin array plastic package (TAPP), multi-layer organic or low temperature co-fired ceramics. A plurality of bond pads may be disposed spaced-apart on the die 102 to provide contact pads to which electrical connections may be made.

Figure 2:
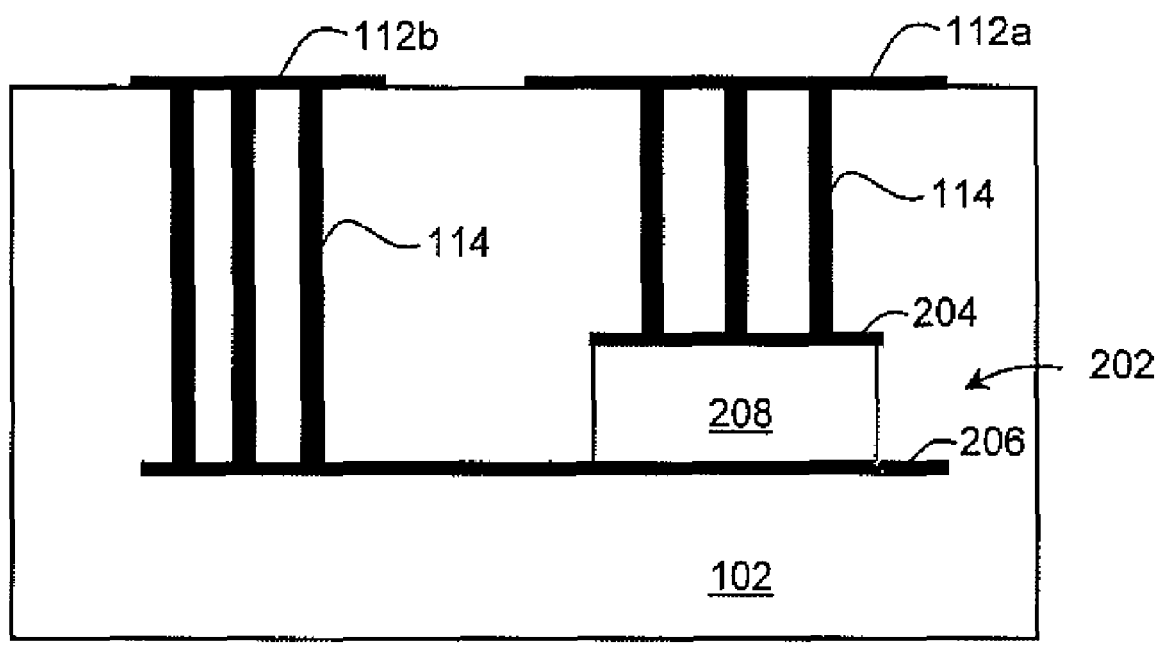
FIG. 2 is a cross-sectional view of a metal-insulator-metal (MIM) capacitor used in FIG. 1A.

To implement a single harmonic rejection, a first inductor-capacitor combination may be provided, which incorporates a first metal-insulator-metal (MIM) capacitor 202 within the die 102. Both the die 102 and MIM capacitor 202 may be fabricated using conventional die processing steps. FIG. 2 illustrates a cross-sectional view of a MIM capacitor used in the embodiment of FIG. 1A. The first MIM capacitor 202 may comprise a top electrode 204, a bottom electrode 206, and a dielectric material 208 interposed therebetween. The first MIM capacitor 202 may be serially coupled between a first bond pad 112a and a second bond pad 112b. Electrical connectors, such as vias 114, may be employed to make connections between the top electrode 204 and the first bond pad 112a, and between the bottom electrode 206 and the second bond pad 112b. The first bond pad 112a (or amplifier output bond pad) may be coupled to an output of the die 102 while the second bond pad 112b (or downbond pad) may be coupled to the package ground 104. As illustrated, the first MIM capacitor 202 may be disposed under the bond pads to reduce package space required and thereby reduce the form factor of the microelectronic package 100.

The main inductance between the output of the power amplifier and the input to an antenna is provided by the first wire bond 210 coupling the first bond pad 112a to the package output 118. The shunt inductance or downbond between the bottom electrode of the first MIM capacitor 202 and the package ground 104 is provided by a second wire bond 220 coupling the second bond pad 112b to the package output 118. Examples of suitable materials for the wire bonds include, but are not limited to, gold, aluminum and copper. Examples of suitable materials used as dielectrics of the MIM capacitors include, but are not limited to, silicon nitride and silicon dioxide.

Figure 1B:
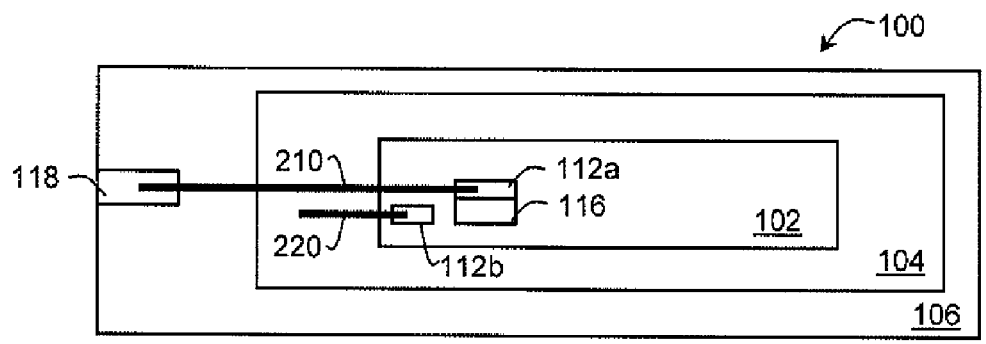
FIG. 1B is a top view of the output harmonic rejection filter in the microelectronic package of FIG. 1A.
Figure 1C:
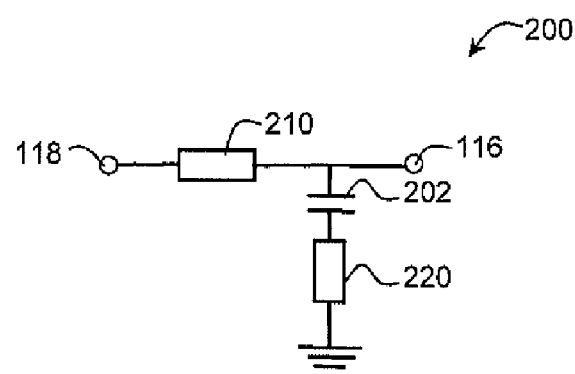
FIG. 1C is a schematic representation of the output harmonic rejection filter of FIG. 1A.

FIG. 1B is a top view of the output harmonic rejection filter of the microelectronic package of FIG. 1A and illustrates the above-described wire bond connections 210, 220. A schematic representation of the output harmonic rejection filter 200 described above is illustrated in FIG. 1C.

While the harmonic rejection filter in the above embodiment is a notch filter to provide for a single harmonic rejection, embodiments of the invention are not limited as such. Modifications to the above embodiment may be made to implement multiple harmonic rejections where required. To implement a multiple-rejection output harmonic rejection filter, multiple wire bonds are connected in parallel along main signal transmission and, further, multiple inductor-capacitor (LC) combinations are connected in parallel along the shunt branch.

Figure 3A:
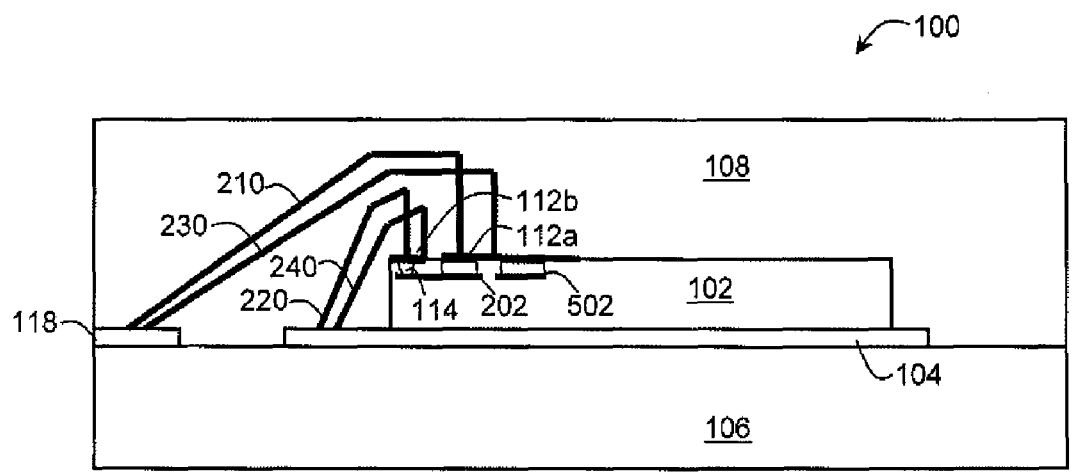
FIG. 3A is a partial cross-sectional view of a microelectronic package incorporating a multiple-rejection output harmonic rejection filter according to one embodiment of the invention.
Figure 3B:
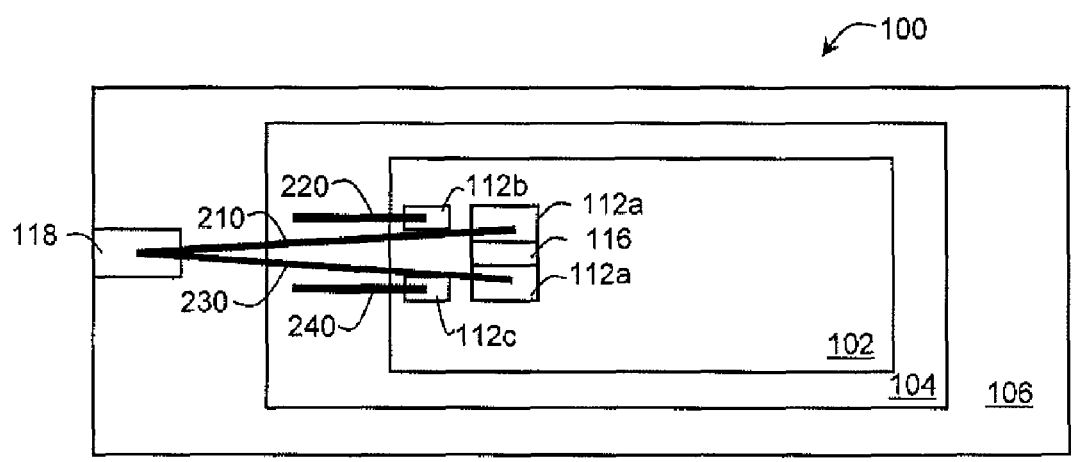
FIG. 3B is a top view of the output harmonic rejection filter in the microelectronic package of FIG. 3A.

FIG. 3A is a partial cross-sectional view of a microelectronic package incorporating a multiple-rejection output harmonic rejection filter 500 configured to reject two harmonics. FIG. 3B is a top view of the output harmonic rejection filters of the microelectronic package of FIG. 3A. The embodiment of FIGS. 3A and 3B comprises a first inductor-capacitor combination and a second inductor-capacitor combination connected in parallel. This parallel arrangement is serially coupled between the amplifier output 116 and the package ground 104 and is configured to resonate at different frequencies to reject multiple harmonics. The embodiment of FIG. 3A further comprises a parallel arrangement of a first wire bond 210 and a second wire bond 230. This other parallel arrangement is serially coupled between the amplifier output 116 and the package output 118.

Figure 3C:
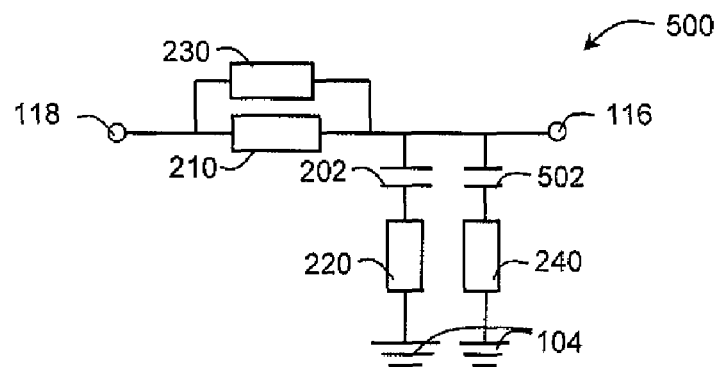
FIG. 3C is a schematic representation of the output harmonic rejection filter of FIG. 3A.

More particularly, the first inductor-capacitor combination comprises a first MIM capacitor 202 serially coupled between a first bond pad 112a, which is coupled to the amplifier output 116, and a second bond pad 112b. The first bond pad 112a (or amplifier output bond pad) may be coupled to an output 118 of the package 100 via a first wire bond 210, while the second bond pad 112b (or downbond pad) may be coupled to the package ground 104 via a second wire bond 220. The second inductor-capacitor combination comprises a second MIM capacitor 502 serially coupled between a first bond pad 112a and a third bond pad 112c via a third wire bond 230 to the package output 118. A fourth wire bond 240 connects the third bond pad 112c (or downbond pad) to the package ground 104. The third bond pad 112c should be electrically isolated from the second bond pad 112b. A schematic representation of the output harmonic rejection filter 500 described above is illustrated in FIG. 3C.

Figure 4A:
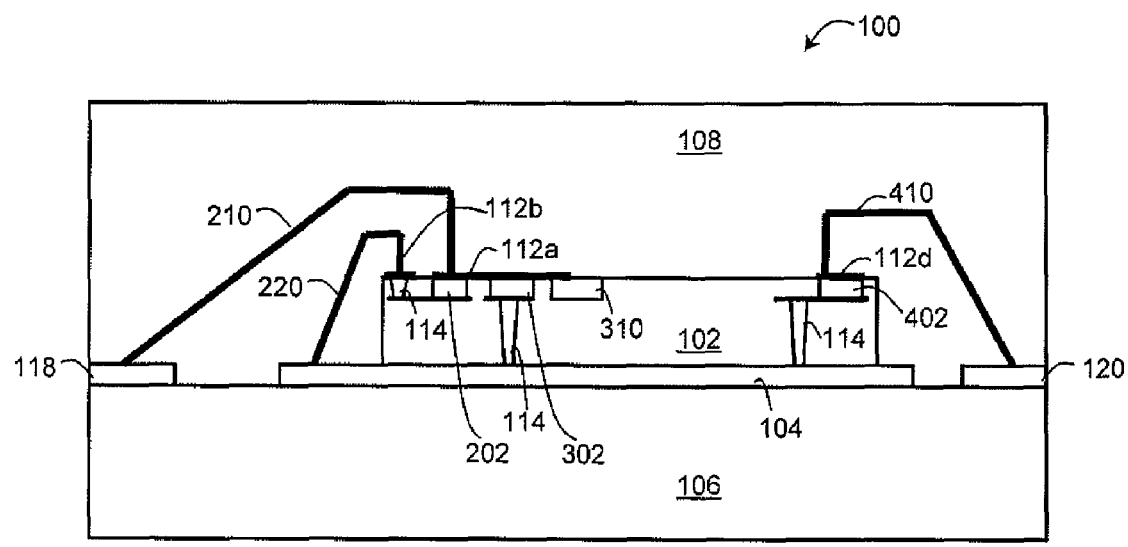
FIG. 4A is a partial cross-sectional view of a microelectronic package incorporating a output harmonic rejection filter, an input matching circuit and an output matching circuit according to one embodiment of the invention.
Figure 4B:
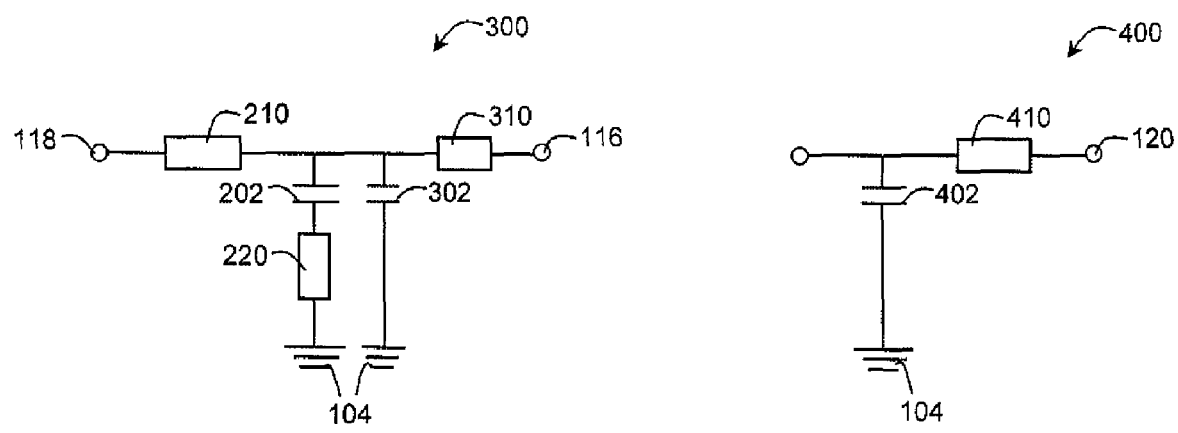
FIG. 4B is a schematic representation of the output harmonic rejection filter and output matching circuit of FIG. 4A.

FIG. 4A is a partial cross-sectional view of a microelectronic package 100 incorporating the output harmonic rejection filter 200 of FIG. 1A, an output matching circuit 300 and an input matching circuit 400. To implement the output matching circuit 300, an output matching MIM capacitor 302 is coupled in parallel to the first MIM capacitor 202 between the first bond pad 112a and the package ground 104. More particularly, the top electrode of the output matching MIM capacitor 302 may be coupled to the first bond pad 112a while the bottom electrode of the capacitor 302 may be coupled to the package ground 104. Similarly, vias 114 may be provided as electrical connections to and from the second MIM capacitor 302. An inductor 310, e.g. a spiral inductor, is serially coupled between the first bond pad 112a and the amplifier output 116. A schematic representation of the combination of the output harmonic rejection filter 200 and output matching circuit 300 is illustrated in FIG. 4B.

Figure 4C:
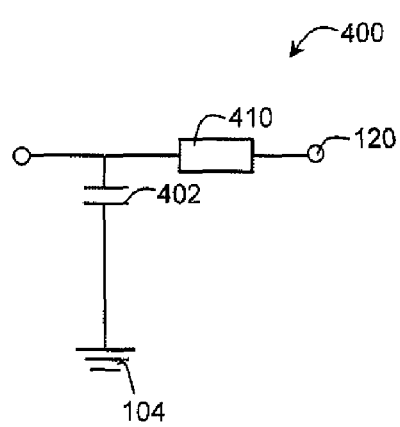
FIG. 4C is a schematic representation of the input matching circuit of FIG. 4A.

The output matching circuit 300 is matched at the input of the amplifier die 102 by a corresponding input matching circuit 400 comprising an input matching MIM capacitor 402 serially coupled between an input matching bond pad 112d and the package ground 104. More particularly, the top electrode of the MIM capacitor 402 may be coupled to the input matching bond pad 112d while the bottom electrode of the input matching MIM capacitor 402 may be coupled to the package ground 104. Similarly, vias 114 may be provided as electrical connections to and from the input matching MIM capacitor 402. A wire bond 410 is provided to couple the input matching bond pad 112d to a package input 120. A schematic representation of the input matching circuit 400 is illustrated in FIG. 4C.

The above-described die 102, harmonic rejection filter and matching circuits may be encapsulated in a mold material 108 to form an integral part of a RF microelectronic package 100. Embodiments of the invention are applicable to packages with single die as well as to packages with multiple dies. Radio Frequency (RF) modules largely involve multiple dies built on a package substrate. In such packages, each die may be capped using a molding cap material.

Reference is made to FIG. 1A where, during operation, signals from the amplifier output 116 are fed through the output matching circuit 300 to the output harmonic rejection filter 200 to be processed. At most frequencies, signal transmission occurs through the main inductance of the output harmonic rejection filter 200 (corresponding to the first wire bond 210) with unrejected signals transmitted to the package output 118. At the predetermined harmonic frequency, however, the parasitic capacitance (corresponding to the first MIM capacitor 202) resonates with the downbond or shunt inductance (corresponding to the second wire bond 220) to create a low-impedance signal path to the ground 104. The low-impedance path therefore provides a transmission path for the undesired harmonic signal. The desired harmonic rejection frequency may be adjusted by varying the capacitance or the inductance. Generally, a larger capacitance value or a larger inductance value corresponds to lower frequency of harmonic rejection, and vice versa. In general, the capacitance value may be increased by increasing the dimensions of the electrodes. The inductance value may be controlled by varying the length of the bond wires or by connecting several wire bonds in parallel, in which an increase in the number of parallel wire bonds results in decreased inductance.

Embodiments of the invention are particularly advantageous in providing microelectronic packages with small form factor and at reduced costs. The use of wire bonds reduces the number of spiral inductors implemented on the active die and therefore reduces package space required and accordingly, manufacturing costs. Form factor is further reduced by disposing the MIM capacitor(s) under the bond pads. Using the above design, the package form factor reduction may range between about 5% to about 10%. With increased adoption of Multiple-input multiple-output (MIMO) architecture in Front-End modules involving multiple power amplifier outputs, embodiments of the invention would result in substantial reduction in form factor and manufacturing costs. At the same time, quality factor (Q factor) is improved due to reduced insertion loss in signal transmission path with the use of wire bond as part of the harmonic rejection filter. With improved Q factor, electrical performance of both filtering and matching circuits are enhanced.

Other embodiments will be apparent to those skilled in the art from consideration of the specification and practice of the present invention. Furthermore, certain terminology has been used for the purposes of descriptive clarity, and not to limit the invention. The embodiments and features described above should be considered exemplary, with the invention being defined by the appended claims.

What is claimed is:

1. A microelectronic package comprising:
a die mounted on a substrate, the die having at least a radio frequency amplifier circuit formed thereon and an amplifier output;
a plurality of bond pads formed on the die;
a first filter integrally formed in the die to process a signal from the amplifier output, the first filter including:
a first metal-insulator-metal (MIM) capacitor serially coupled between a first and a second of the bond pads;
a first wire bond coupling the first of the bond pads to a package output, wherein the first of the bond pads is coupled to the amplifier output; and
a second wire bond coupling the second of the bond pads to a package ground.

2. The microelectronic package of claim 1, wherein the first MIM capacitor is disposed under the bond pads.

3. The microelectronic package of claim 2, wherein the first filter further including a plurality of vias coupling the first MIM capacitor to the first and the second of the bond pads.

4. The microelectronic package of claim 1, wherein the die and the first filter are encapsulated by a mold material.

5. The microelectronic package of claim 1, further comprising a second filter integrally formed in the die, the second filter including:
a second MIM capacitor coupled in parallel to the first MIM capacitor between the first and a third of the bond pads; and
a third wire bond coupling the third of the bond pads to the package ground.

6. The microelectronic package of claim 5, wherein the first MIM capacitor and the second MIM capacitor are disposed under the bond pads.

7. The microelectronic package of claim 1, further comprising an output matching circuit integrally formed in the die, the output matching circuit including:
an output matching MIM capacitor coupled in parallel to the first MIM capacitor between the first of the bond pads and the package ground; and
an inductor coupled between the amplifier output and the first of the bond pads.

8. The microelectronic package of claim 7, further comprising an input matching circuit integrally formed in the microelectronic package, the input matching circuit including:
an input matching MIM capacitor coupled between the package ground and an input matching bond pad; and
a third wire bond coupling the input matching bond pad to a package input.

9. The microelectronic package of claim 1, wherein the radio frequency amplifier circuit is a power amplifier device.

* * * * *